(12) United States Patent
Yang

(10) Patent No.: US 6,821,876 B2
(45) Date of Patent: Nov. 23, 2004

(54) FABRICATION METHOD OF STRENGTHENING FLIP-CHIP SOLDER BUMPS

(75) Inventor: Ke-Chuan Yang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/400,349

(22) Filed: Mar. 26, 2003

(65) Prior Publication Data

US 2004/0048458 A1 Mar. 11, 2004

(30) Foreign Application Priority Data

Sep. 10, 2002 (TW) ......................................... 91120550 A

(51) Int. Cl.[7] ............................................ H01L 21/44
(52) U.S. Cl. .................. 438/612; 438/613; 438/614
(58) Field of Search ................................ 438/612–614; 257/782–785

(56) References Cited

U.S. PATENT DOCUMENTS

| | | | |
|---|---|---|---|
| 5,268,072 A | 12/1993 | Agarwala et al. | 156/664 |
| 5,503,286 A | 4/1996 | Nye, III et al. | 216/13 |
| 5,937,320 A | 8/1999 | Andricacos et al. | 438/614 |
| 6,297,140 B1 | 10/2001 | Uzoh et al. | 438/612 |
| 6,602,775 B1 * | 8/2003 | Chen et al. | 438/612 |
| 2002/0020855 A1 * | 2/2002 | Hwang | 257/200 |
| 2003/0017647 A1 * | 1/2003 | Kwon et al. | 438/109 |

FOREIGN PATENT DOCUMENTS

JP 411537 11/2000

\* cited by examiner

*Primary Examiner*—Dung A. Le
(74) *Attorney, Agent, or Firm*—Peter F. Corless; Steven M. Jensen; Edwards & Angell, LLP

(57) ABSTRACT

A fabrication method for strengthening flip-chip solder bumps is provided to form a solder bump on a UBM (under bump metallurgy) structure formed over a semiconductor chip, which can prevent the UBM structure against oxidation and contamination and also enhance bondability between the solder bump and UBM structure, thereby improving reliability for packaging the semiconductor chip. This fabrication method is characterized in that before forming the solder bump, a dielectric layer made of BCB (benzo-cyclo-butene) or polyimide is deposited on the UBM structure, and used to protect the UBM structure against oxidation and contamination. Further, before forming the solder bump, a plasma-etching process is performed to remove the dielectric layer; the plasma-etching process is environmental-friendly without having to use a chemical solvent.

12 Claims, 3 Drawing Sheets

FABRICATION METHOD OF STRENGTHENING FLIP-CHIP SOLDER BUMPS

BACKGROUND OF THE INVENTION

1. Field of the Invention

This invention relates to semiconductor packaging technology for fabricating solder bumps on a UBM (Under Bump Metallurgy) structure over a semiconductor chip, and more particularly, to a fabrication method for strengthening flip-chip solder bumps, whereby the UBM structure is protected from oxidation and contamination to assure the solder bumps are reliably bonded to the UBM structure.

2. Description of Related Art

Flip-chip (FC) package assemblies involve an advanced type of semiconductor packaging technology characterized by having a semiconductor chip mounted in an upside-down manner over a substrate formed with an array of solder-bump pads, allowing an active surface of the chip to be mechanically bonded and electrically coupled to the substrate by means of solder bumps. Since a wire bonding (WB) process is not required for fabricating a FC package structure, the package product is fabricated with a more compact size.

In the FC technology, Sn/Pb-based solder has poor bondability with the aluminum-based I/O pad, and the UBM structure has good bondability with both the Sn/Pb-based solder and aluminum-based I/O pad, so a UBM structure is usually formed on each aluminum-based I/O (input/output) pad formed on the active surface of the chip. After solder bumps are formed over the UBM structure, a reflow process is performed to bond and align the solder bumps in position over the UBM structure on the I/O pads.

The process of forming flip-chip solder bumps can be implemented through various techniques, such as electroplating, screen printing, and evaporation, to name just a few.

However, one drawback of conventional flip-chip solder bumping technologies is exposing the UBM structure to the atmosphere prior to bonding the solder bumps thereon, whereby the exposed UBM structure would be easily subject to oxidation and contamination by chemicals used in lithographic processes, thereby undesirably degrading the bondability between the UBM structure and the solder bumps.

Related prior art references include, for example, the following patents:

U.S. Patent Application No. 2002/0072215 "METHOD FOR FORMING BARRIER LAYERS FOR SOLDER BUMPS";

U.S. Pat. No. 5,268,072 "ETCHING PROCESSES FOR AVOIDING EDGE STRESS IN SEMICONDUCTOR CHIP SOLDER BUMPS";

U.S. Pat. No. 5,503,286 "ELECTROPLATED SOLDER TERMINAL";

U.S. Pat. No. 5,937,320 "BARRIER LAYERS FOR ELECTROPLATED SNPB EUTECTIC SOLDER JOINTS";

U.S. Pat. No. 6,297,140 "METHOD TO PLATE C4 TO COPPER STUD"; to name just a few.

Among the above references, U.S. Patent Application 2002/0072215 proposes a solution to the aforementioned problem by forming a temporary metal layer over the UBM structure for protecting the UBM structure against oxidation and contamination, and finally using a chemical etchant to etch away the temporary metal layer. One drawback to this solution, however, is that it would make the overall fabrication processes more complex to implement; and still one drawback is that the chemical etchant is pollutant and environment unfriendly. All the other aforementioned U.S. patents provide no solution to the problem of the UBM structure being subjected to oxidation and contamination during the fabrication processes.

SUMMARY OF THE INVENTION

It is therefore an objective of this invention to provide a fabrication method for strengthening flip-chip solder bumps, which is able to protect a UBM structure against oxidation and contamination to assure a solder bump to be reliably bonded to the UBM structure and thereby assure the quality of the flip-chip package.

It is another objective of this invention to provide a fabrication method for strengthening flip-chip solder bumps, which can be implemented without having to utilize chemical etchants thereby making the fabrication method more environment friendly.

In accordance with the above and other objectives, this invention proposes a fabrication method for strengthening solder bumps on a UBM (Under Bump Metallurgy) structure over a semiconductor chip to protect the UBM structure from oxidation and contamination to assure the solder bumps are reliably bonded to the UBM structure and thereby assure the quality of the semiconductor package.

The fabrication method according to the invention is characterized by formation of a dielectric layer made of benzo-cyclo-butene (BCB) or polyimide on the surface of UBM, to protect the UBM structure against oxidation and contamination during a solder bump forming process. In subsequent processes, the dielectric layer is removed by a plasma etching technique. Since the plasma etching process can be implemented without using chemical etchants, the invention is more environmentally friendly than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of a fabrication method for strengthening flip-chip solder bumps according to the invention is disclosed in full details as follows with reference to FIGS. 1 and 2A–2F.

Figure 1:
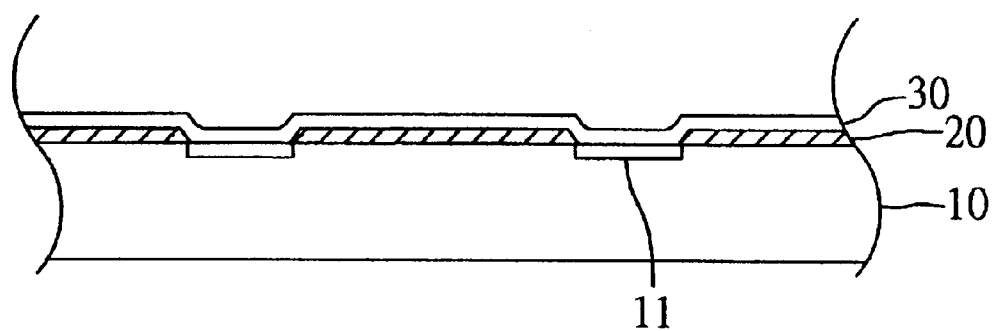
FIG. 1 is a cross-sectional view of a semiconductor chip with a UBM structure formed thereon.

FIG. 1 illustrates a semiconductor chip 10 with a UBM (Under Bump Metallurgy) structure formed thereon. As shown in the drawing, this chip 10 is formed with a plurality of I/O pads 11 which serve as externally connecting points for the internal circuitry (not shown) of the chip 10. In addition, the chip 10 is formed with a passivation layer 20 which covers all the areas over the chip 10 but exposing the I/O pads 11. Further, a UBM structure 30 is formed over the passivation layer 20 and all of the I/O pads 11. Since the UBM structure is fabricated by conventional and well-known semiconductor fabrication technology, description thereof is not to be further detailed herein.

The objective of the invention is to fabricate solder bumps over the UBM structure 30 while protecting the UBM structure 30 from oxidation and contamination prior to processes of forming the solder bumps. The procedural steps of the fabrication method for strengthening flip-chip solder bumps according to the invention are disclosed in details with reference to FIGS. 2A–2F.

Figure 2A:
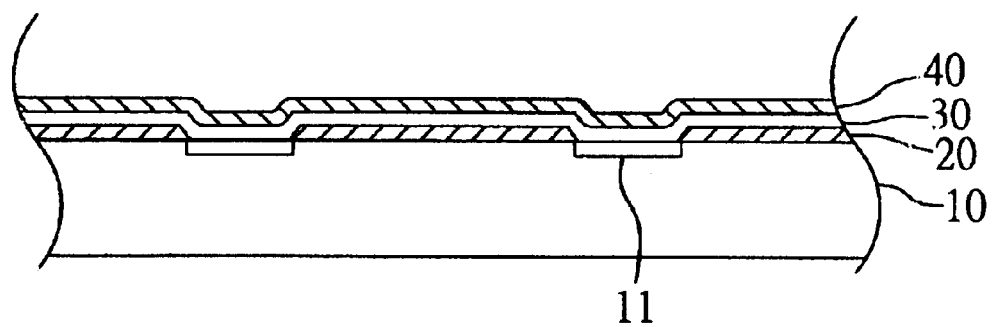
FIGS. 2A–2F are schematic diagrams used to depict the procedural steps of the fabrication method for strengthening flip-chip solder bumps according to the invention.

Referring to FIG. 2A, the first step is to form a dielectric layer 40 over the entire surface of the UBM structure 30. The dielectric layer 40 can be made of a material, for example, benzo-cyclo-butene (BCB) or polyimide, and is formed through a coating process. Since the coating of BCB or polyimide employs conventional and well-known semiconductor fabrication technology, description thereof is not to be further detailed herein.

Figure 2B:
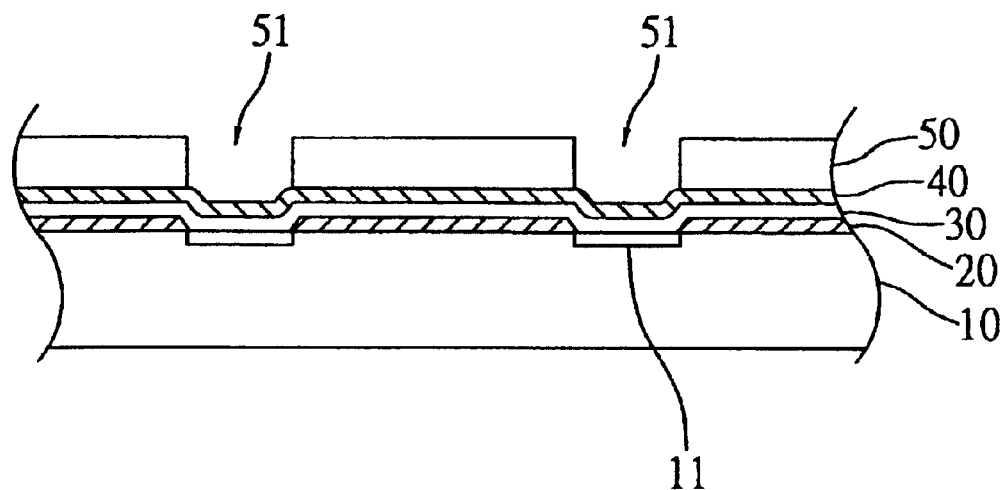

Referring to FIG. 2B, the next step is to form a photoresist layer 50 over the dielectric layer 40, and the photoresist layer 50 is selectively removed to form a plurality of openings 51 to expose the portions of the dielectric layer 40 that are directly laid over the I/O pads 11. The fabrication of the photoresist layer 50 and its openings 51 can be implemented through conventional lithographic processes.

Figure 2C:
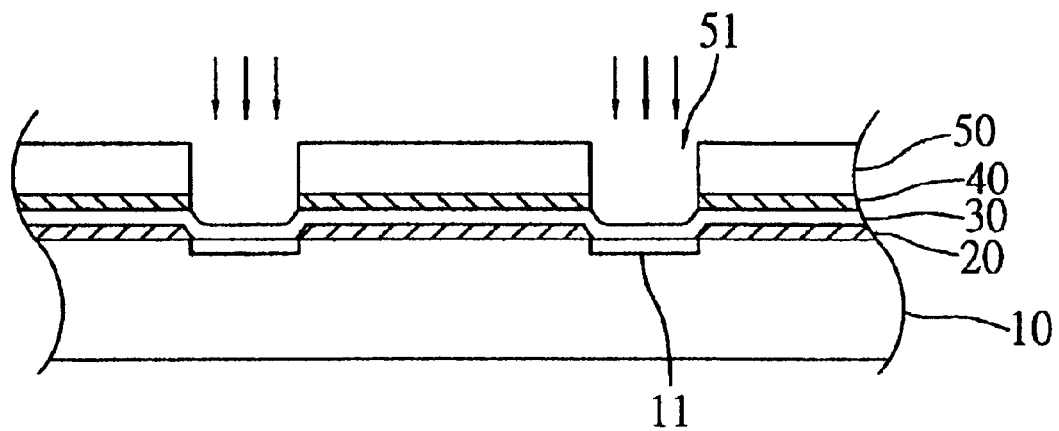

Referring to FIG. 2C, subsequently, an etching process is performed to etch away the portions of the dielectric layer 40 exposed via the openings 51 of the photoresist layer 50 through the use of plasma etching technology until the underlying UBM structure 30 is exposed.

Figure 2D:
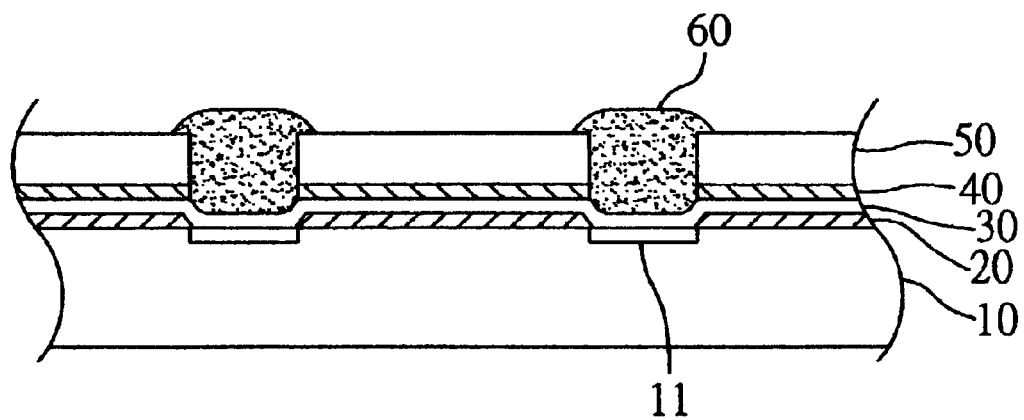

Referring next to FIG. 2D, an electroplating process is performed to plate a solder material for filling up the openings 51 of the photoresist layer 50 and onto the exposed surface of the UBM structure 30, whereby a solder bump 60 is formed in each of the openings 51 of the photoresist layer 50.

Figure 2E:
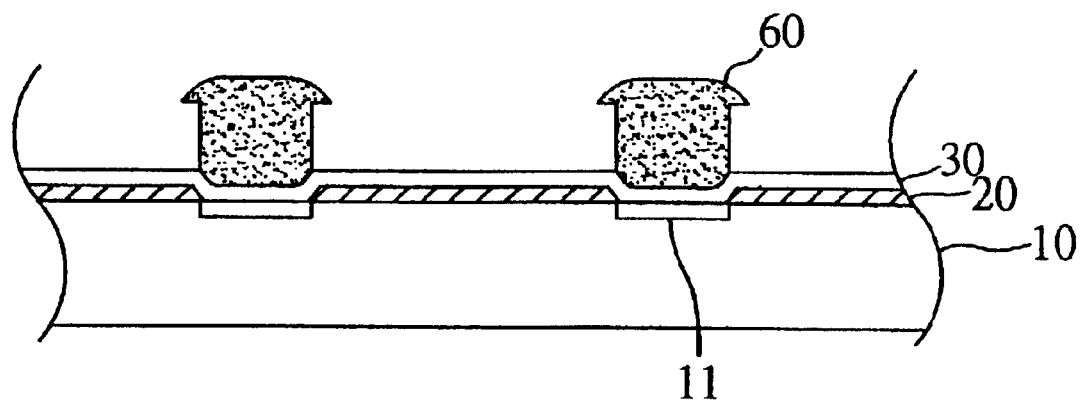

Referring next to FIG. 2E, the entire photoresist layer 50 and all the remaining portions of the dielectric layer 40 are removed. In this step, the photoresist layer 50 can be removed through, for example, a photoresist stripping process, while the remaining portions of the dielectric layer 40 can be removed by a plasma etching process.

Figure 2F:
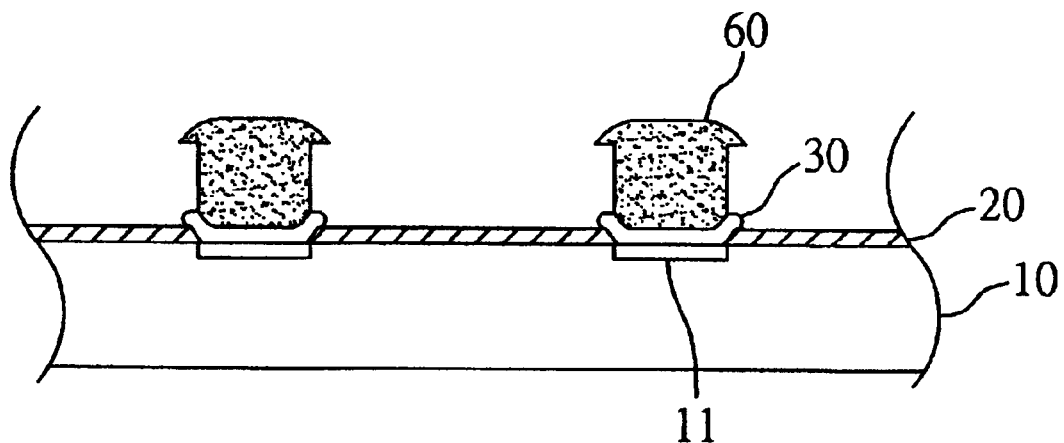

Referring finally to FIG. 2F, an etching process is performed to remove those portions of the UBM structure 30 that are uncovered by the solder bumps 60.

Subsequent steps to finish the packaging of the chip 10 include solder-reflow, die bonding, encapsulation, etc.; since all these steps employ conventional techniques and are not within the spirit and scope of this invention, description thereof is not to be further detailed herein.

In conclusion, this invention provides a fabrication method that is able to assure bonding of solder bumps on a UBM structure, which is characterized by formation of a dielectric layer made of benzo-cyclo-butene (BCB) or polyimide, to protect the UBM structure against oxidation and contamination during a solder bumping process. In subsequent processes, the dielectric layer is removed by a plasma etching technique. Since the plasma etching process can be implemented without using chemical etchants, the invention is more environmentally friendly and thus more advantageous over the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method for strengthening flip-chip solder bumps, for use on a semiconductor chip having a plurality of bond pads formed with a UBM structure thereon, the fabrication method comprising the steps of:

(1) forming a dielectric layer over the UBM structure;

(2) forming a photoresist layer over the dielectric layer, wherein the photoresist layer is formed with a plurality of openings for exposing portions of the dielectric layer that are directly laid over the bond pads;

(3) removing the exposed portions of the dielectric layer that are uncovered by the photoresist layer, wherein the removal of the exposed portions of the dielectric layer is implemented through a plasma etching process;

(4) forming a solder bump in each of the openings of the photoresist layer;

(5) removing the photoresist layer entirely, and then removing all the remaining portions of the dielectric layer; and (6) removing portions of the UBM structure that are uncovered by the solder bumps.

2. The fabrication method of claim 1, wherein in said step (1), the dielectric layer is made of benzo-cyclo-butene (BCB).

3. The fabrication method of claim 1, wherein in said step (1), the dielectric layer is made of polyimide.

4. The fabrication method of claim 1, wherein in said step (4), the formation of the solder bump is implemented through an electroplating process.

5. The fabrication method of claim 1, wherein in said step (5), the removal of the remaining portions of the dielectric layer is implemented through a plasma etching process.

6. A fabrication method for strengthening flip-chip solder bumps, for use on a semiconductor chip having a plurality of bond pads formed with a UBM structure thereon, the fabrication method comprising the steps of:

(1) forming a dielectric layer over the UBM structure;

(2) forming a photoresist layer over the dielectric layer, wherein the photoresist layer is formed with a plurality of openings for exposing portions of the dielectric layer that are directly laid over the bond pads;

(3) performing a plasma-etching process to remove the exposed portions of the dielectric layer that are uncovered by the photoresist layer;

(4) forming a solder bump in each of the openings of the photoresist layer;

(5) removing the photoresist layer entirely, and then performing a plasma-etching process to remove all the remaining portions of the dielectric layer; and (6) removing portions of the UBM structure that are uncovered by the solder bumps.

7. The fabrication method of claim 6, wherein in said step (1), the dielectric layer is made of benzo-cyclo-butene (BCB).

8. The fabrication method of claim 6, wherein in said step (1), the dielectric layer is made of polyimide.

9. The fabrication method of claim 6, wherein in said step (4), the formation of the solder bump is implemented through an electroplating process.

10. A fabrication method for strengthening flip-chip solder bumps, for use on a semiconductor chip having a plurality of bond pads formed with a UBM structure thereon, the fabrication method comprising the steps of:

(1) forming a dielectric layer over the UBM structure;

(2) forming a photoresist layer over the dielectric layer, wherein the photoresist layer is formed with a plurality of openings for exposing portions of the dielectric layer that are directly laid over the bond pads;

(3) performing a plasma-etching process to remove the exposed portions of the dielectric layer that are uncovered by the photoresist layer;

(4) performing an electroplating process to form a solder bump in each of the openings of the photoresist layer;

(5) removing the photoresist layer entirely, and then performing a plasma-etching process to remove all the remaining portions of the dielectric layer; and (6) removing portions of the UBM structure that are uncovered by the solder bumps.

11. The fabrication method of claim 10, wherein in said step (1), the dielectric layer is made of benzo-cyclo-butene (BCB).

12. The fabrication method of claim 10, wherein in said step (1), the dielectric layer is made of polyimide.

* * * * *